(12) United States Patent
Hsin

(10) Patent No.: US 9,721,976 B2
(45) Date of Patent: Aug. 1, 2017

(54) THIN FILM TRANSISTOR AND FABRICATION METHOD THEREOF, ARRAY SUBSTRATE AND DISPLAY PANEL

(71) Applicant: BOE TECHNOLOGY GROUP CO., LTD., Beijing (CN)

(72) Inventor: Lung Pao Hsin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/912,822

(22) PCT Filed: Aug. 18, 2015

(86) PCT No.: PCT/CN2015/087400
§ 371 (c)(1),
(2) Date: Feb. 18, 2016

(87) PCT Pub. No.: WO2016/150082
PCT Pub. Date: Sep. 29, 2016

(65) Prior Publication Data
US 2017/0040343 A1   Feb. 9, 2017

(30) Foreign Application Priority Data

Mar. 24, 2015 (CN) .......................... 2015 1 0130610

(51) Int. Cl.
*H01L 21/00* (2006.01)
*H01L 27/00* (2006.01)
(Continued)

(52) U.S. Cl.
CPC ............ *H01L 27/124* (2013.01); *H01L 21/77* (2013.01); *H01L 27/02* (2013.01); *H01L 29/06* (2013.01);
(Continued)

(58) Field of Classification Search
CPC . H01L 27/124; H01L 27/1288; H01L 27/023; H01L 29/786; H01L 29/66742;
(Continued)

(56) References Cited

U.S. PATENT DOCUMENTS 5,903,029 A   5/1999   Hayashida et al.
6,232,158 B1   5/2001   Lee
(Continued)

FOREIGN PATENT DOCUMENTS

CN           1610859 A    4/2005
CN         102082180 A    6/2011
(Continued)

OTHER PUBLICATIONS

International Search Report of PCT/CN2015/087400 in Chinese, mailed Nov. 25, 2015 with English translation.
(Continued)

*Primary Examiner* — Nikolay Yushin
(74) *Attorney, Agent, or Firm* — Collard & Roe, P. C.

(57) ABSTRACT

A thin film transistor and a fabrication method thereof, an array substrate and a display panel are provided. The thin film transistor includes: a gate electrode (2), a source electrode (5) and a drain electrode (6) disposed in a same layer on a base substrate (1); a gate insulating layer (3) disposed on the gate electrode (2), the source electrode (5) and the drain electrode (6); an active layer (4) disposed on the gate insulating layer (3); a passivation layer (7) disposed on the active layer (4) and the gate insulating layer (3). A first via hole (81) and a second via hole (91) are disposed in the passivation layer (7); a third via hole (82) and a fourth via hole (92) are disposed in the passivation layer (7) and the gate insulating layer (3); a first connection pattern (8) and a second connection pattern (9) are disposed on the passivation layer (7); the first connection pattern (8) is connected (Continued)

with the active layer (4) and the source electrode (5) through the first via hole (81) and the third via hole (82) respectively; the second connection pattern (9) is connected with the active layer (4) and the drain electrode (6) through the second via hole (91) and the fourth via hole (92) respectively. The thin film transistor effectively reduces the influence of the parasitic capacitance between the source electrode and the gate electrode and the parasitic capacitance between the drain electrode and the gate electrode on the thin film transistor.

20 Claims, 6 Drawing Sheets

(51) Int. Cl.
| | | |
|---|---|---|
| *H01L 29/00* | (2006.01) | |
| *H01L 27/12* | (2006.01) | |
| *H01L 21/77* | (2017.01) | |
| *H01L 27/02* | (2006.01) | |
| *H01L 29/786* | (2006.01) | |
| *H01L 29/06* | (2006.01) | |
| *H01L 29/417* | (2006.01) | |
| *H01L 29/51* | (2006.01) | |
| *H01L 29/66* | (2006.01) | |

(52) U.S. Cl.
CPC ...... *H01L 29/41733* (2013.01); *H01L 29/517* (2013.01); *H01L 29/66742* (2013.01); *H01L 29/786* (2013.01)

(58) Field of Classification Search
CPC . H01L 29/41733; H01L 29/517; H01L 21/77; H01L 21/441; H01L 21/47573
See application file for complete search history.

(56) References Cited

U.S. PATENT DOCUMENTS

| | | | |
|---|---|---|---|
| 6,969,889 | B2 | 11/2005 | Cho et al. |
| 8,389,991 | B2 | 3/2013 | Morosawa et al. |
| 9,285,631 | B2* | 3/2016 | Kong ................ G02F 1/133555 |
| 2004/0055997 | A1* | 3/2004 | Park .................. G02F 1/136286 |
| | | | 216/9 |
| 2009/0159887 | A1 | 6/2009 | Huh et al. |
| 2012/0080753 | A1* | 4/2012 | Singh ..................... B82Y 30/00 |
| | | | 257/347 |
| 2012/0146971 | A1 | 6/2012 | Yoon et al. |
| 2012/0313093 | A1 | 12/2012 | Kim et al. |
| 2014/0138717 | A1* | 5/2014 | Kong ................ G02F 1/133555 |
| | | | 257/88 |
| 2016/0254285 | A1 | 9/2016 | Long et al. |

FOREIGN PATENT DOCUMENTS

| | | |
|---|---|---|
| CN | 102184968 A | 9/2011 |
| CN | 102540602 A | 7/2012 |
| CN | 103474470 A | 12/2013 |
| CN | 103915444 A | 7/2014 |
| CN | 104282769 A | 1/2015 |
| CN | 104393051 A | 3/2015 |
| CN | 104681630 A | 6/2015 |

OTHER PUBLICATIONS

Notice of Transmittal of the International Search Report of PCT/CN2015/087400 in Chinese, mailed Nov. 25, 2015.
Written Opinion of the International Searching Authority of PCT/CN2015/087400 in Chinese, mailed Nov. 25, 2015 with English translation.
Chinese Office Action in Chinese Application No. 201510130610.8, mailed Feb. 24, 2017 with English translation.

\* cited by examiner

THIN FILM TRANSISTOR AND FABRICATION METHOD THEREOF, ARRAY SUBSTRATE AND DISPLAY PANEL

CROSS REFERENCE TO RELATED APPLICATIONS

This application is the National Stage of PCT/CN2015/087400 filed on Aug. 18, 2015, which claims priority under 35 U.S.C. §119 of Chinese Application No. 201510130610.8 filed on Mar. 24, 2015, the disclosure of which is incorporated by reference.

TECHNICAL FIELD

Embodiments of the present disclosure relate to a thin film transistor and a fabrication method thereof, an array substrate and a display panel.

BACKGROUND

FIG. 1 is a cross section schematic view of a thin film transistor. As shown in FIG. 1, the thin film transistor includes: a gate electrode 2 disposed on a base substrate 1, a gate insulating layer 3 disposed on the gate electrode 2, an active layer 4 disposed on the gate insulating layer 3, a source electrode 5 and a drain electrode 6 disposed on the active layer 4. In the case that the voltage applied to the gate electrode is higher than the threshold voltage of the thin film transistor, the source electrode 5 and the drain electrode 6 are electrically connected with each other through the active layer 4 and the carriers flow from the source electrode 5 to the drain electrode 6 or flow from the drain electrode 6 to the source electrode 5.

SUMMARY

At least one embodiment of the present disclosure provides a thin film transistor. The thin film transistor includes: a gate electrode, a source electrode and a drain electrode disposed in a same layer on a base substrate; a gate insulating layer disposed on the gate electrode, the source electrode and the drain electrode; an active layer disposed on the gate insulating layer; and a passivation layer disposed on the active layer and the gate insulating layer. A first via hole and a second via hole are disposed in the passivation layer at locations regions which corresponding to the active layer; a third via hole and a fourth via hole are disposed in the passivation layer and the gate insulating layer at locations regions respectively which corresponding to the source electrode and the drain electrode respectively. A first connecting patternconnection pattern and a second connecting patternconnection pattern are disposed in a same layer on the passivation layer; the first connecting patternconnection pattern is connected with the active layer and the source electrode through the first via hole and the third via hole respectively; the second connecting patternconnection pattern is connected with the active layer and the drain electrode through the second via hole and the fourth via hole respectively.

For example, the a dielectric constant of the passivation layer is less than 2.8.

For example, a material of the passivation layer is formed of SiOC.

For example, the gate electrode comprises: a gate conductive pattern and a gate barrier pattern disposed on the gate conductive pattern; the source electrode comprises: a source conductive pattern and a source barrier pattern disposed on the source conductive pattern; the drain electrode comprises: a drain conductive pattern and a drain barrier pattern disposed on the drain conductive pattern; and the gate conductive pattern, the source conductive pattern and the drain conductive pattern are disposed in the a same layer, and the gate barrier pattern, the source barrier pattern and the drain barrier pattern are disposed in the a same layer.

For example, a material of each of the gate conductive pattern, the source conductive pattern and the drain conductive pattern is formed of copper or copper alloy; a material of each of the gate barrier pattern, the source barrier pattern and the drain barrier pattern is formed of titanium or titanium alloy.

For example, the a dielectric constant of the gate insulating layer is greater than 3.9.

For example, the gate insulating layer is formed of at least one of or any combination of $Al_2O_3$, $Ta_2O_5$, $TiO_2$, $HfO_2$, $ZrO_2$, $La_2O_3$ and $Pr_2O_3$.

At least one embodiment of the present disclosure provides a fabrication method of a thin film transistor. The method comprises: forming a gate electrode, a source electrode and a drain electrode which are disposed in a same layer on a base substrate; forming a gate insulating layer on the base substrate, the gate electrode, the source electrode and the drain electrode; forming an active layer on the gate insulating layer; forming a passivation layer on the active layer and the gate insulating layer, wherein a first via hole and a second via hole are disposed in the passivation layer at regions corresponding to the active layer, and a third via hole and a fourth via hole are disposed in the passivation layer and the gate insulating layer at regions respectively corresponding to the source electrode and the drain electrode; and forming a first connection pattern and a second connection pattern which are disposed in a same layer on the passivation layer; wherein the first connection pattern is connected with the active layer and the source electrode through the first via hole and the third via hole respectively; the second connection pattern is connected with the active layer and the drain electrode through the second via hole and the fourth via hole respectively.

For example, a dielectric constant of the passivation layer is less than 2.8.

For example, the passivation layer is formed of SiOC.

For example, the forming the gate electrode, the source electrode and the drain electrode on the substrate comprises: forming a gate conductive pattern, a source conductive pattern and a drain conductive pattern on the base substrate; and forming a gate barrier pattern on the gate conductive pattern, forming a source barrier pattern on the source conductive pattern, and forming a drain barrier pattern on the drain conductive pattern.

For example, a copper film or a copper alloy film is formed on the base substrate through a deposition process; and the gate conductive pattern, the source conductive pattern and the drain conductive pattern are formed by wet etching the copper film or the copper alloy film.

For example, a titanium film or a titanium alloy film is formed on the base substrate, the gate conductive pattern, the source conductive pattern and the drain conductive pattern through a deposition process; and the gate barrier pattern is formed on the gate conductive pattern, the source barrier pattern is formed on the source conductive pattern, and the drain barrier pattern is formed on the drain conductive pattern by dry etching the titanium film or the titanium alloy film.

For example, after forming the first connection pattern and the second connection pattern on the passivation layer, the method further comprises: annealing the thin film transistor so that oxygen vacancies in the active layer are filled by oxygen atoms from the gate insulating layer.

For example, a dielectric constant of the gate insulating layer is greater than 3.9. For example, the gate insulating layer is formed of at least one of or any combination of $Al_2O_3$, $Ta_2O_5$, $TiO_2$, $HfO_2$, $ZrO_2$, $La_2O_3$ and $Pr_2O_3$.

At least one embodiment of the present disclosure provides an array substrate. The array substrate includes a thin film transistor, and the thin film transistor is any one of the above thin film transistors.

For example, the array substrate is an array substrate in the liquid crystal display panel, and the array substrate further comprises: a pixel electrode. The pixel electrode and the second connection pattern are disposed in a same layer and the pixel electrode is connected with the second connection pattern.

For example, the array substrate is an array substrate in the OLED display panel, and the array substrate further comprises: a positive electrode and a pixel defining layer. The positive electrode and the second connection pattern are disposed in a same layer and the positive electrode is connected with the second connection pattern.

At least one embodiment of the present disclosure further provides a display panel. The display panel includes an array substrate, and the array substrate is any one of the above array substrate.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
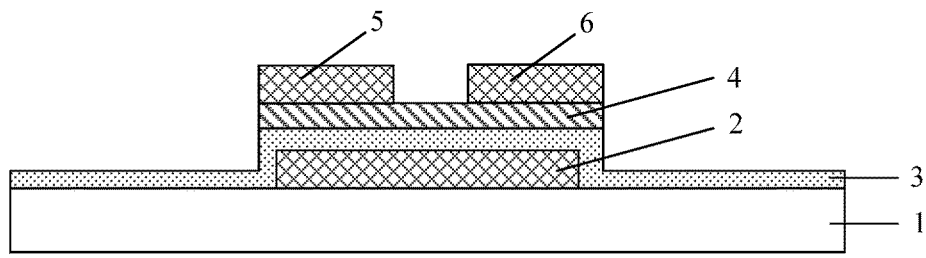
FIG. 1 is a cross section schematic view of a thin film transistor.

The inventor found that, in the case that the thin film transistor in FIG. 1 is turned on, a high parasitic capacitance between the source electrode 5 and the gate electrode 2 and a high parasitic capacitance between the drain electrode 6 and the gate electrode 2 are both caused. These parasitic capacitances will interfere with the movements of the carriers in the active layer so that the performance of the thin film transistor is decreased.

First Embodiment

Figure 2:
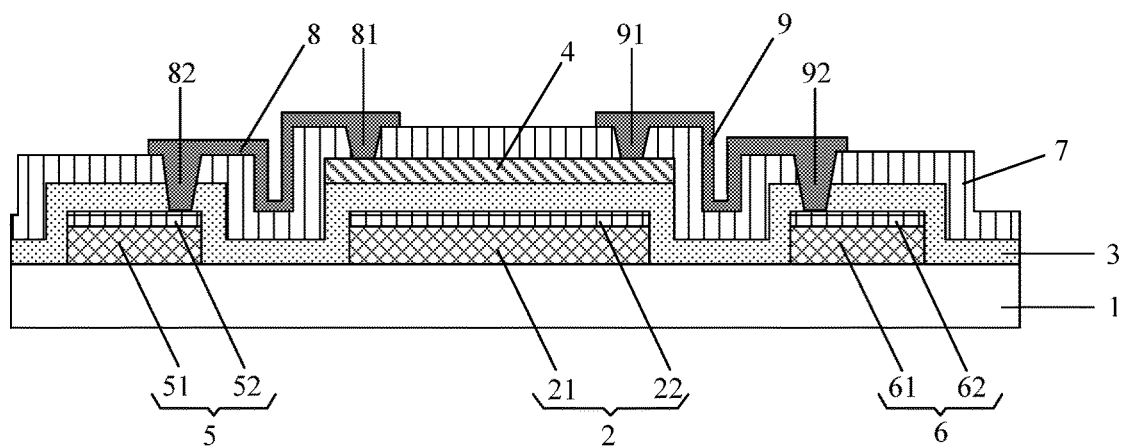
FIG. 2 is a cross section schematic view of a thin film transistor provided by a first embodiment of the present disclosure.

FIG. 2 is a cross section schematic view of a thin film transistor provided by the first embodiment of the present disclosure. As shown in FIG. 2, the thin film transistor includes a gate electrode 2, a source electrode 5 and a drain electrode 6 which are disposed in a same layer on the base substrate 1; a gate insulating layer 3 disposed on the gate electrode 2, the source electrode 5 and the drain electrode 6; an active layer 4 disposed on the gate insulating layer 3; and a passivation layer 7 disposed on the active layer 4 and the gate insulating layer 3. A first via hole 81 and a second via hole 91 are disposed in the passivation layer 7 at regions corresponding to the active layer 4; a third via hole 82 and a fourth via hole 92 are disposed in the passivation layer 7 and the gate insulating layer 3 at regions respectively corresponding to the source electrode 5 and the drain electrode 6; a first connection pattern 8 and a second connection pattern 9 are disposed in a same layer on the passivation layer 7; the first connection pattern 8 is connected with the active layer 4 and the source electrode 5 through the first via hole 81 and the third via hole 82 respectively; the second connection pattern 9 is connected with the active layer 4 and the drain electrode 6 through the second via hole 91 and the fourth via hole 92 respectively.

It is to be noted that, each of the first connection pattern 8 and the second connection pattern 9 is a conductor, the active layer 4 and the source electrode 5 are electrically connected with each other by the first connection pattern 8, the active layer 4 and the drain electrode 6 are electrically connected with each other by the second connection pattern 9.

The source electrode 5 and the drain electrode 6 are disposed in the same layer as the gate electrode 2 in the embodiment of the present disclosure, so that the parasitic capacitance between the source electrode 5 and the gate electrode 2 and the parasitic capacitance between the drain electrode 6 and the gate electrode 2 are provided on lateral sides of the thin film transistor, thus reducing the influence of the parasitic capacitances on the movements of the carriers in the active layer 4. Besides, the source electrode 5 and the drain electrode 6 are disposed in the same layer as the gate electrode 2, so that the parasitic capacitance between the source electrode and the gate electrode and the parasitic capacitance between the drain electrode and the gate electrode are effectively reduced.

For example, the dielectric constant of the passivation layer 7 is less than 2.8. In the present embodiment, the source electrode 5 is disposed in the same layer as the gate electrode 2 and the region between the source electrode 5 and the gate electrode 2 is filled with the passivation layer 7. The passivation layer 7 is made of the material with the dielectric constant less than 2.8 (a relatively low dielectric constant), so that on the basis of ensuring the insulation performance of the passivation layer 7, the parasitic capacitance between the gate electrode 2 and the source electrode 5 and the parasitic capacitance between the gate electrode 2 and the drain electrode 6 both are effectively reduced, thus the influence of the parasitic capacitances on the thin film transistor is effectively reduced. In the present embodiment, a material of the passivation layer 7 for example is SiOC.

Besides, in the thin film transistor of the present embodiment, the active layer 4 for example is completely covered by the passivation layer 7, so the passivation layer 7 effectively prevents adverse influences of the water vapor of the outside environment on the active layer 4.

In the present embodiment, the gate electrode 2, the source electrode 5 and the drain electrode 6 are disposed in the same layer, and in this case, the gate electrode 2, the source electrode 5 and the drain electrode 6 for example are formed simultaneously. For example, the gate electrode 2, the source electrode 5 and the drain electrode 6 are of double-layer structures. For example, the gate electrode 2 comprises: a gate conductive pattern 21 and a gate barrier pattern 22 disposed on the gate conductive pattern 21; the source electrode 5 comprises: a source conductive pattern 51 and a source barrier pattern 52 disposed on the source conductive pattern 51; the drain electrode 6 comprises: a drain conductive pattern 61 and a drain barrier pattern 62 disposed on the drain conductive pattern 61. For example, the gate conductive pattern 21, the source conductive pattern 51 and the drain conductive pattern 61 are disposed in the same layer and are formed simultaneously, and the gate barrier pattern 22, the source barrier pattern 52 and the drain barrier pattern 62 are disposed in the same layer and are formed simultaneously. Each of the gate conductive pattern 21, the source conductive pattern 51 and the drain conductive pattern 61 for example is configured to conduct electricity, and the gate barrier pattern 22, the source barrier pattern 52 and the drain barrier pattern 62 for example are respectively configured to prevent diffusion of the materials of the gate conductive pattern 21, the source conductive pattern 51 and the drain conductive pattern 61.

For example, the gate conductive pattern 21, the source conductive pattern 51 and the drain conductive pattern 61 are formed of copper or copper alloy. Copper has a lower resistance and is capable of forming a sharp profile in the case it is etched; therefore, in the case that each conductive pattern is formed by copper, not only the conductivity of each conductive pattern is ensured but also the shape precision of each conductive pattern is ensured. For example, the gate barrier pattern 22, the source barrier pattern 52 and the drain barrier pattern 62 is formed of titanium or titanium alloy. The physical properties of titanium are relatively stable, and titanium effectively prevents the diffusion of copper.

For example, the dielectric constant of the gate insulating layer 3 is greater than 3.9. In the case that the gate insulating layer 3 is made of a material with the dielectric constant greater than 3.9 (a relatively high dielectric constant), the gate insulating layer 3 blocks the current well and so that the leakage current of the thin film transistor is reduced, and thus the internal power consumption of the thin film transistor is reduced. In the present embodiment, the gate insulating layer 3 is formed of at least one of or any combination of $Al_2O_3$, $Ta_2O_5$, $TiO_2$, $HfO_2$, $ZrO_2$, $La_2O_3$ and $Pr_2O_3$.

Second Embodiment

Figure 3:
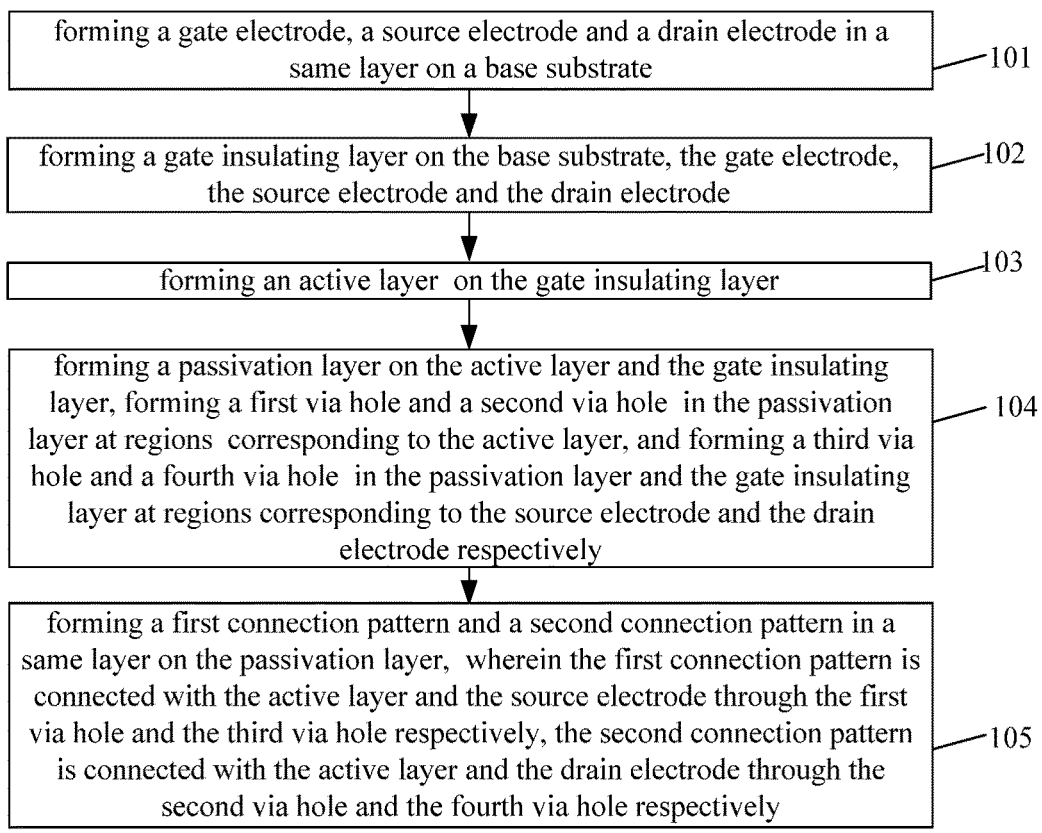
FIG. 3 is a flow diagram of a fabrication method of a thin film transistor provided by a second embodiment of the present disclosure.

FIG. 3 is a flow diagram of the fabrication method of the thin film transistor provided by the second embodiment of the present disclosure. As shown in FIG. 3, the fabrication method comprises steps 101 to 105.

Step 101: forming a gate electrode, a source electrode and a drain electrode which are disposed in a same layer on a base substrate.

In step 101, for example, the gate electrode 2, the source electrode 5 and the drain electrode 6 are formed simultaneously through a patterning process.

It should be noted that, the patterning process of the present disclosure includes the procedures of coating photoresist, exposure, development, etching and photoresist stripping etc.

Step 102: forming a gate insulating layer on the base substrate, the gate electrode, the source electrode and the drain electrode.

In step 102, for example, the gate insulating layer 3 is deposited on the structures formed in step 101 through a vapor deposition process.

Step 103: forming an active layer on the gate insulating layer.

In step 103, the active layer 4 is provided on the gate insulating layer 3 through a patterning process. For example, the active layer 4 is formed of an oxide semiconductor.

Step 104: forming a passivation layer on the active layer and the gate insulating layer, forming a first via hole and a second via hole disposed in the passivation layer at regions corresponding to the active layer, and forming a third via hole and a fourth via hole disposed in the passivation layer and the gate insulating layer at regions corresponding to the source electrode and the drain electrode respectively.

In step 104, for example, the passivation layer 7 is firstly deposited on the structures formed in step 103 through a plasma enhanced chemical vapor deposition (PECVD) process. Then, the first via hole 81 and the second via hole 91 are disposed in the passivation layer 7 at regions which correspond to the active layer 4 through an etching process, and the third via hole 82 and the fourth via hole 92 are disposed in the passivation layer 7 and the gate insulating layer 3 at regions which correspond to the source electrode 5 and the drain electrode 6 respectively. It should be noted that, the first via hole 81, the second via hole 91, the third via hole 82 and the fourth via hole 92 for example are formed through one patterning process.

Step 105: forming a first connection pattern and a second connection pattern which are disposed in a same layer on the passivation layer. The first connection pattern is connected with the active layer through the first via hole, the first connection pattern is connected with the source electrode through the third via hole, the second connection pattern is connected with the active layer through the second via hole, and the second connection pattern is connected with the drain electrode through the fourth via hole.

In step 105, the first connection pattern 8 and the second connection pattern 9 are disposed on the passivation layer 7 for example through one patterning process. The source electrode 5 is connected with the active layer 4 through the first connection pattern 8 and the drain electrode 6 is connected with the active layer 4 through the second connection pattern 9. In the present embodiment, for example, the first connection pattern 8 and the second connection pattern 9 are formed of ITO.

In the thin film transistor fabricated by step 101 to step 105, the source electrode 5 and the drain electrode 6 are disposed in the same layer as the gate electrode 2, so that the parasitic capacitance between the source electrode 5 and the gate electrode 2 and the parasitic capacitance between the drain electrode 6 and the gate electrode 2 are provided on lateral sides of the thin film transistor, and thus the influence of the parasitic capacitances on the thin film transistor is effectively reduced, and the performance of the thin film transistor is further effectively enhanced. Besides, the source electrode 5 and the drain electrode 6 are disposed in the same layer, so that the parasitic capacitance between the source electrode 5 and the gate electrode 2 and the parasitic capacitance between the drain electrode 6 and the gate electrode 2 are effectively reduced. Furthermore, the active layer 4 is completely covered by the passivation layer 7, so that the passivation layer 7 effectively prevents the bad effects of the water vapor in the outside environment on the active layer 4.

Third Embodiment

Figure 4:
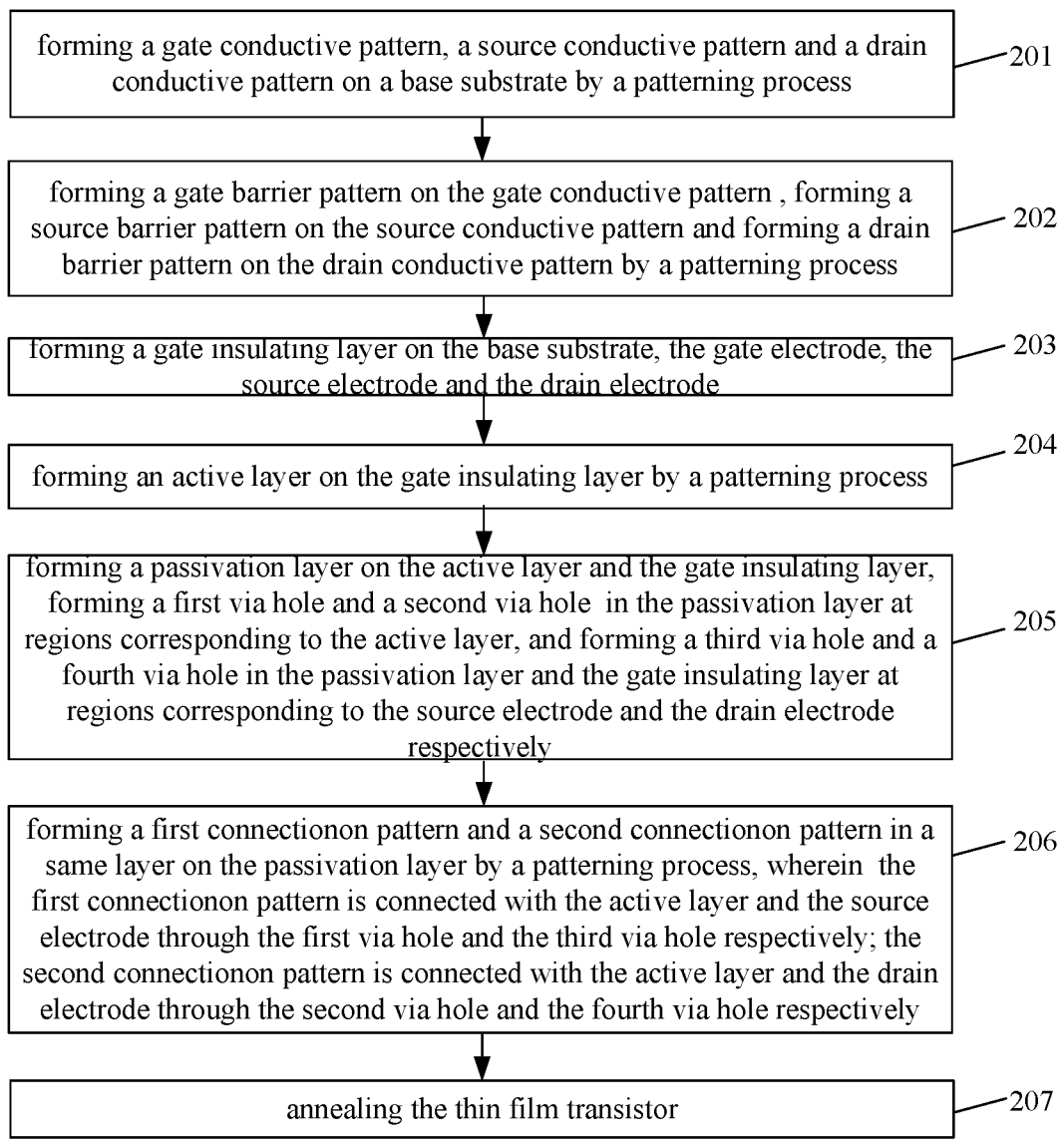
FIG. 4 is a flow diagram of the fabrication method of the thin film transistor provided by a third embodiment of the present disclosure.

FIG. 4 is a flow diagram of the fabrication method of the thin film transistor provided by the third embodiment of the present disclosure, FIGS. 5a to 5e are cross section schematic views of the fabrication method of the thin film transistor provided by the third embodiment of the present disclosure. As shown in FIG. 4 and FIGS. 5a to 5e, the fabrication method fabricates the thin film transistor showed in FIG. 2, and the fabrication method for example comprises the following steps 201 to 207.

Step 201: forming a gate conductive pattern, a source conductive pattern and a drain conductive pattern on the base substrate through a patterning process.

Figure 5A:
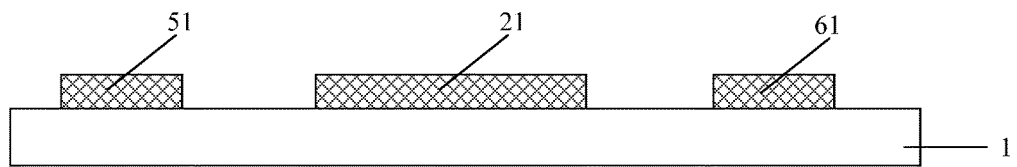
FIGS. 5a to 5e are cross section schematic views of the fabrication method of the thin film transistor provided by the third embodiment of the present disclosure.

For example, the gate conductive pattern, the source conductive pattern and the drain conductive pattern are simultaneously formed by one patterning process. Referring to FIG. 5a, for example, in step 201, the gate conductive pattern 21, the source conductive pattern 51 and the drain conductive pattern 61 are formed of copper or copper alloy, and step 201 includes steps 2011 to 2012:

Step 2011: depositing a copper film or a copper alloy film on the base substrate through a deposition process; and Step 2012: forming the gate conductive pattern 21, the source conductive pattern 51 and the drain conductive pattern 61 by wet etching the copper film or the copper alloy film.

Step 202: forming a gate barrier pattern 22 on the gate conductive pattern 21, forming a source barrier pattern 52 on the source conductive pattern 51 and forming a drain barrier pattern 62 on the drain conductive pattern 62 through a patterning process.

Figure 5B:
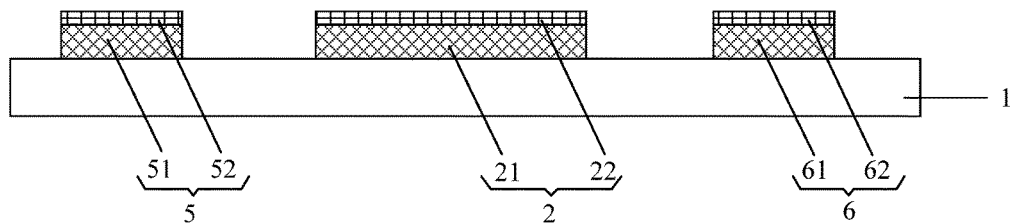

For example, the gate barrier pattern 22, the source barrier pattern 52 and the drain barrier pattern 62 are simultaneously formed by one patterning process. Referring to FIG. 5b, for example, in step 202, the gate barrier pattern 22, the source barrier pattern 52 and the drain barrier pattern 62 are formed of titanium or titanium alloy, and step 202 includes steps 2021 to 2022:

Step 2021: depositing a titanium film or a titanium alloy film on the base substrate, the gate conductive pattern 21, the source conductive pattern 51 and the drain conductive pattern 61 through a deposition process.

Step 2022: forming the gate barrier pattern 22 on the gate conductive pattern 21, forming the source barrier pattern 52 on the source conductive pattern 51 and forming the drain barrier pattern 62 on the drain conductive pattern 61 by dry etching the titanium film or the titanium alloy film.

In this case, the gate conductive pattern 21 and the gate barrier pattern 22 are stacked to form the gate electrode 2; the source conductive pattern 51 and the source barrier pattern 52 are stacked to form the source electrode 5; the drain conductive pattern 61 and the drain barrier pattern 62 are stacked to form the drain electrode 6. Each of the electrodes (the gate electrode 2, the source electrode 5 and the drain electrode 6) with two-layer structure not only has excellent conductivity, but also has good stability (diffusion phenomenon will not occur). Step 203: forming a gate insulating layer on the base substrate, the gate electrode, the source electrode and the drain electrode.

Figure 5C:
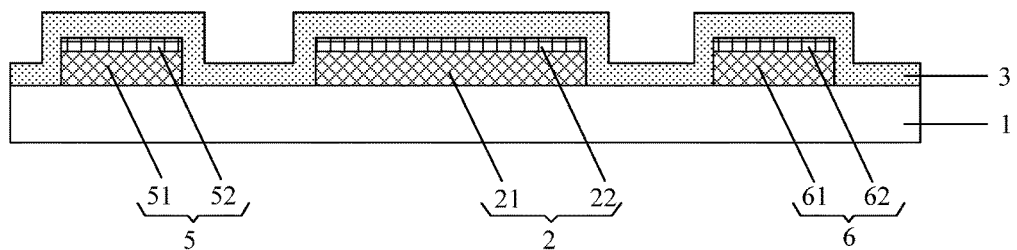

Referring to FIG. 5c, in step 203, for example, the gate insulating layer 3 is deposited on the structures formed in step 202 through a vapor deposition process. For example, the dielectric constant of the gate insulating layer 3 is greater than 3.9. For example, the gate insulating layer 3 is formed of at least one of or any combination of $Al_2O_3$, $Ta_2O_5$, $TiO_2$, $HfO_2$, $ZrO_2$, $La_2O_3$ and $Pr_2O_3$.

Step 204: forming an active layer on the gate insulating layer through a patterning process.

Figure 5D:
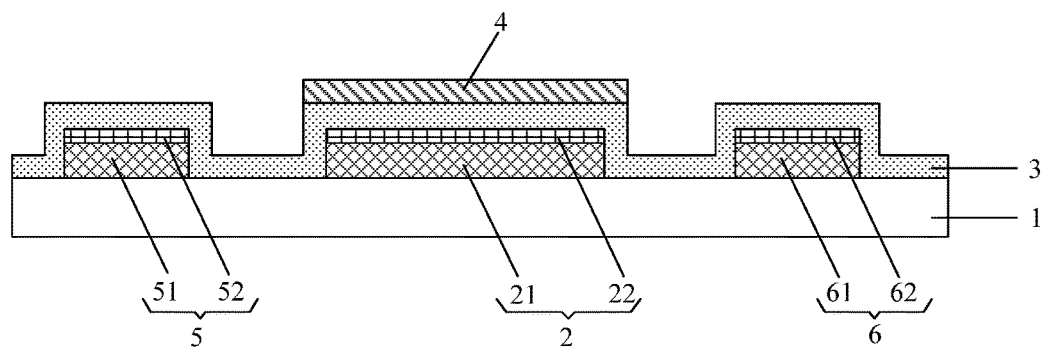

Referring to FIG. 5d, in step 204, the active layer 4 is provided on the gate insulating layer 3 through one patterning process. For example, the active layer 4 is formed of an oxide semiconductor.

Step 205: forming a passivation layer on the active layer and the gate insulating layer, forming a first via hole and a second via hole in the passivation layer at regions which correspond to the active layer, and forming a third via hole and a fourth via hole in the passivation layer and the gate insulating layer at regions which correspond to the source electrode and the drain electrode respectively.

Figure 5E:
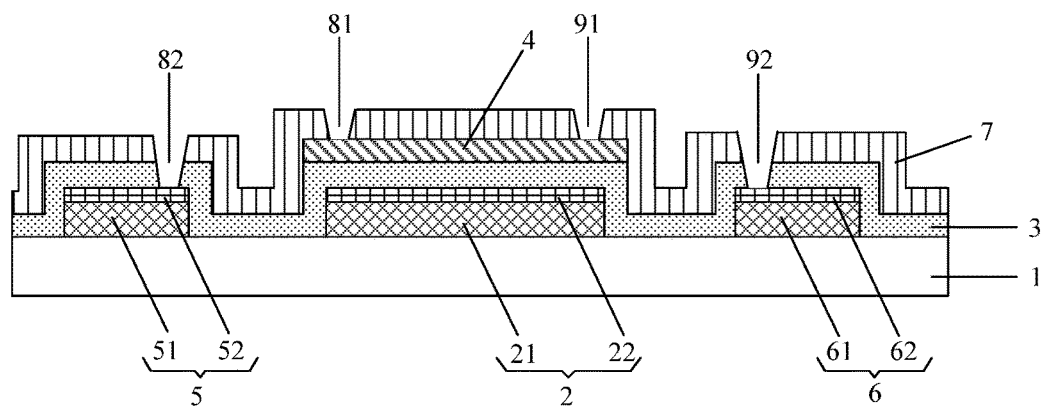

Referring to FIG. 5e, in step 205, for example, the dielectric constant of the passivation layer 7 is less than 2.8, and the passivation layer is made of SiOC.

Step 206: forming a first connection pattern and a second connection pattern which are disposed in a same layer on the passivation layer through a patterning process. The first connection pattern is connected with the active layer through the first via hole, the first connection pattern is connected with the source electrode through the third via hole, the second connection pattern is connected with the active layer through the second via hole, and the second connection pattern is connected with the drain electrode through the fourth via hole.

Referring to FIG. 2, the active layer 4 is connected with the source electrode 5 through the first connection pattern 8, and the active layer 4 is connected with the drain electrode 6 through the second connection pattern 9.

Step 207: annealing the thin film transistor.

In step 207, part of the oxygen atoms in the gate insulating layer 3 are diffused by annealing the thin film transistor. The oxygen atoms diffused from the gate insulating layer 3 fill the oxygen vacancies in the active layer 4 so that the stability of the active layer 4 is guaranteed. Besides, the oxygen atoms diffused from the gate insulating layer 3 oxidize part of the titanium in the gate barrier pattern 22, the source barrier pattern 52 and the drain barrier pattern 62 to obtain a $TiO_2$ film, the $TiO_2$ film not only plays the role of preventing the diffusion of the copper, but also the $TiO_2$ film in the source barrier pattern 52 provides an effective ohmic contact between the first connection pattern 8 and the source electrode 5 and the $TiO_2$ film in the drain barrier pattern 62 provides an effective ohmic contact between the second connection pattern 9 and the drain electrode 6. Besides, the $TiO_2$ film in the gate barrier pattern 22 cooperates with the gate insulating layer 3 to further reduce the leakage current of the thin film transistor. For example, in the step, high temperature furnace or infrared irradiation is employed to anneal the thin film transistor.

Fourth Embodiment

An array substrate is provided by the fourth embodiment of the present disclosure. The array substrate comprises a thin film transistor. For example, the thin film transistor is the thin film transistor provided by the first embodiment and the thin film transistor is fabricated by the fabrication methods provided in the second embodiment or the third embodiment. For example, the array substrate includes multiple gate lines and multiple data lines, the gate lines and the data lines cross with each other to define multiple pixel units which are arranged in matrix. Each of the pixel units includes a thin film transistor used as a switching component and a pixel electrode used for controlling the arrangement of liquid crystal, and the pixel unit further includes a common electrode. For example, in each pixel unit, the gate electrode of the thin film transistor and the gate line are electrically connected or formed integrally; in each pixel unit, the source electrode of the thin film transistor and the data line are electrically connected or formed integrally; in each pixel unit, the drain electrode of the thin film transistor and the pixel electrode are electrically connected or formed integrally. The following description mainly for single or multiple pixel units, and other pixel unit are formed similarly.

Figure 6:
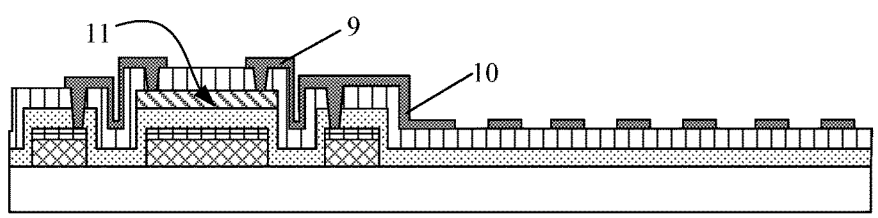
FIG. 6 is a cross section schematic view of an array substrate provided by the fourth embodiment of the present disclosure.

FIG. 6 is a cross section schematic view of the array substrate provided by the fourth embodiment of the present disclosure. As shown in FIG. 6, in an embodiment of the present disclosure, the array substrate is an array substrate in a liquid crystal display panel. The array substrate includes: the pixel electrode 10 and the thin film transistor 11 in the first embodiment. The pixel electrode 10 and the second connection pattern 9 are disposed in a same layer and the pixel electrode 10 is connected with the second connection pattern 9. Each of the first connection pattern 8 and the second connection pattern 9 in the thin film transistor 11 is made of the same material as the pixel electrode 10, and the material for example is ITO. In the preparation process of the array substrate, the first connection pattern, the second connection pattern 9 and the pixel electrode 10 for example are simultaneously formed through one patterning process.

Figure 7:
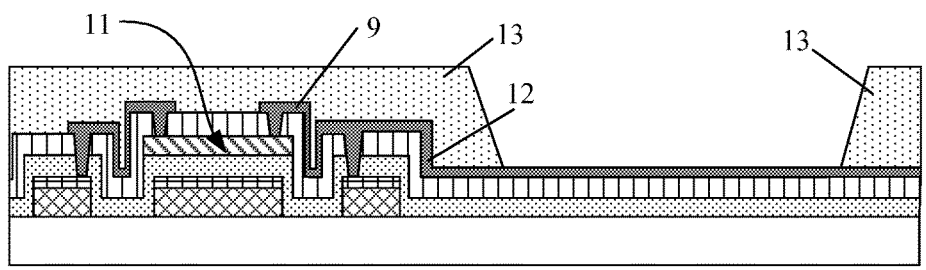
FIG. 7 is another cross section schematic view of the array substrate provided by the fourth embodiment of the present disclosure.

FIG. 7 is another cross section schematic view of the array substrate provided by the fourth embodiment of the present disclosure. As shown in FIG. 7, in another embodiment of the present disclosure, the array substrate is an array substrate in the OLED (Organic Light-Emitting Diode) display panel, and the array substrate comprises: a positive electrode 12, a pixel defining layer 13 and the thin film transistor 11 in the first embodiment, the positive electrode 12 and the second connection pattern 9 are disposed in a same layer, and the positive electrode 12 is connected with the second connection pattern 9. Each of the first connection pattern and the second connection pattern 9 in the thin film transistor 11 is made of the same material as the positive electrode 12, and the material for example is ITO. In the preparation process of the array substrate, the first connection pattern, the second connection pattern 9 and the positive electrode 12 for example are simultaneously formed through one patterning process.

It is to be noted that, in FIG. 6 and FIG. 7, a fifth via hole for example is disposed in the passivation layer and the gate insulating layer at regions corresponding to the drain electrode, and the pixel electrode or the positive electrode is connected with the drain electrode through the fifth via hole.

Fifth Embodiment

A display panel is provided by the fifth embodiment of the present disclosure. The display panel comprises an array substrate, and the array substrate is the array substrate provided by the fourth embodiment. The specific structures of the display panel may refer to the description of the fourth embodiment and the detailed descriptions will be omitted herein.

The thin film transistor and the fabrication method thereof, the array substrate and the display panel are provided in at least one embodiment of the present disclosure. The thin film transistor includes: the gate electrode, the source electrode and the drain electrode which are disposed in the same layer on the base substrate; the gate insulating layer disposed on the gate electrode, the source electrode and the drain electrode; the active layer disposed on the gate insulating layer; the passivation layer disposed on the active layer and the gate insulating layer. The first via hole and the second via hole are disposed in the passivation layer at regions corresponding to the active layer; the third via hole and the fourth via hole are disposed in the passivation layer and the gate insulating layer at regions corresponding to the source electrode and the drain electrode respectively; the first connection pattern and the second connection pattern are disposed in the same layer on the passivation layer; the active layer and the source electrode are connected with each other by the first connection pattern through the first via hole and the third via hole; the active layer and the drain electrode are connected with each other by the second connection pattern through the second via hole and the fourth via hole. The technical solution of the present disclosure effectively reduces the influence of the parasitic capacitance between the source electrode and the gate electrode and the parasitic capacitance between the drain electrode and the gate electrode on the thin film transistor; meanwhile, the active layer is completely covered by the passivation layer, so that the passivation layer effectively prevents the bad effects produced by the water vapor in the outside environment on the active layer.

What are described above is related to the illustrative embodiments of the disclosure only and not limitative to the scope of the disclosure; the scopes of the disclosure are defined by the claims.

The present application claims the priority of the Chinese Patent Application No. 201510130610.8 filed on Mar. 24, 2015, which is incorporated herein by reference as part of the disclosure of the present application.

The invention claimed is:

1. A thin film transistor, comprising:
    a gate electrode, a source electrode and a drain electrode disposed in a same layer on a base substrate;
    a gate insulating layer disposed on the gate electrode, the source electrode and the drain electrode;
    an active layer disposed on the gate insulating layer; and
    a passivation layer disposed on the active layer and the gate insulating layer;
    wherein a first via hole and a second via hole penetrate through the passivation layer and are disposed at regions corresponding to the active layer; a third via hole and a fourth via hole penetrate through the passivation layer and the gate insulating layer and are disposed at regions respectively corresponding to the source electrode and the drain electrode;
    a first connection pattern and a second connection pattern are disposed in a same layer on a side of the passivation layer away from the base substrate; the first connection pattern is connected with the active layer and the source electrode through the first via hole and the third via hole respectively; the second connection pattern is connected with the active layer and the drain electrode through the second via hole and the fourth via hole respectively.

2. The thin film transistor according to claim 1, wherein a dielectric constant of the passivation layer is less than 2.8.

3. The thin film transistor according to claim 1, wherein the passivation layer is formed of SiOC.

4. The thin film transistor according to claim 1, wherein
the gate electrode comprises: a gate conductive pattern and a gate barrier pattern disposed on the gate conductive pattern;
the source electrode comprises: a source conductive pattern and a source barrier pattern disposed on the source conductive pattern;
the drain electrode comprises: a drain conductive pattern and a drain barrier pattern disposed on the drain conductive pattern; and
the gate conductive pattern, the source conductive pattern and the drain conductive pattern are disposed in a same layer, and the gate barrier pattern, the source barrier pattern and the drain barrier pattern are disposed in a same layer.

5. The thin film transistor according to claim 4, wherein
each of the gate conductive pattern, the source conductive pattern and the drain conductive pattern is formed of copper or copper alloy;
each of the gate barrier pattern, the source barrier pattern and the drain barrier pattern is formed of titanium or titanium alloy.

6. The thin film transistor according to claim 1, wherein a dielectric constant of the gate insulating layer is greater than 3.9.

7. The thin film transistor according to claim 6, wherein the gate insulating layer is formed of at least one of or any combination of $Al_2O_3$ $Ta_2O_5$ $TiO_2$ $HfO_2$ $ZrO_2$ $La_2O_3$ and $Pr_2O_3$.

8. An array substrate, comprising the thin film transistor according to claim 1.

9. The array substrate according to claim 8, further comprising: a pixel electrode, wherein the pixel electrode and the second connection pattern are disposed in a same layer and the pixel electrode is connected with the second connection pattern.

10. The array substrate according to claim 8, further comprising: a positive electrode and a pixel defining layer, wherein the positive electrode and the second connection pattern are disposed in a same layer and the positive electrode is connected with the second connection pattern.

11. A display panel, comprising the array substrate according to claim 8.

12. A fabrication method of a thin film transistor, comprising:
forming a gate electrode, a source electrode and a drain electrode which are disposed in a same layer on a base substrate;
forming a gate insulating layer on the base substrate, the gate electrode, the source electrode and the drain electrode;
forming an active layer on the gate insulating layer;
forming a passivation layer on the active layer and the gate insulating layer, wherein a first via hole and a second via hole penetrate through the passivation layer and are disposed at regions corresponding to the active layer, and a third via hole and a fourth via hole penetrate through the passivation layer and the gate insulating layer and are disposed in at regions respectively corresponding to the source electrode and the drain electrode; and
forming a first connection pattern and a second connection pattern which are disposed in a same layer on a side of the passivation layer away from the base substrate; wherein the first connection pattern is connected with the active layer and the source electrode through the first via hole and the third via hole respectively; the second connection pattern is connected with the active layer and the drain electrode through the second via hole and the fourth via hole respectively.

13. The fabrication method of the thin film transistor according to claim 12, wherein a dielectric constant of the passivation layer is less than 2.8.

14. The fabrication method of the thin film transistor according to claim 12, wherein the passivation layer is formed of SiOC.

15. The fabrication method of the thin film transistor according to claim 12, wherein a dielectric constant of the gate insulating layer is greater than 3.9.

16. The fabrication method of the thin film transistor according to claim 15, wherein the gate insulating layer is formed of at least one of or any combination of $Al_2O_3$ $Ta_2O_5$ $TiO_2$ $HfO_2$ $ZrO_2$ $La_2O_3$ and $Pr_2O_3$.

17. The fabrication method of the thin film transistor according to claim 12, wherein the forming the gate electrode, the source electrode and the drain electrode on the substrate comprises:
forming a gate conductive pattern, a source conductive pattern and a drain conductive pattern on the base substrate; and
forming a gate barrier pattern on the gate conductive pattern, forming a source barrier pattern on the source conductive pattern, and forming a drain barrier pattern on the drain conductive pattern.

18. The fabrication method of the thin film transistor according to claim 17, wherein
a copper film or a copper alloy film is formed on the base substrate through a deposition process; and
the gate conductive pattern, the source conductive pattern and the drain conductive pattern are formed by wet etching the copper film or the copper alloy film.

19. The fabrication method of the thin film transistor according to claim 17, wherein
a titanium film or a titanium alloy film is formed on the base substrate, the gate conductive pattern, the source conductive pattern and the drain conductive pattern through a deposition process; and
the gate barrier pattern is formed on the gate conductive pattern, the source barrier pattern is formed on the source conductive pattern, and the drain barrier pattern is formed on the drain conductive pattern by dry etching the titanium film or the titanium alloy film.

20. The fabrication method of the thin film transistor according to claim 19, wherein
after forming the first connection pattern and the second connection pattern on the passivation layer, the method further comprises: annealing the thin film transistor so that oxygen vacancies in the active layer are filled by oxygen atoms from the gate insulating layer.

* * * * *